United States Patent [19]
Lambrecht, Jr. et al.

[11] Patent Number: 5,619,791
[45] Date of Patent: Apr. 15, 1997

[54] METHOD FOR FABRICATING HIGHLY CONDUCTIVE VIAS

[75] Inventors: Vincent G. Lambrecht, Jr., Millington; Henry H. Law, Berkeley Heights, both of N.J.; Apurba Roy, Rockwall, Tex.; John Thomson, Jr., Spring Lake; Te-Sung Wu, New Providence, both of N.J.

[73] Assignee: Lucent Technologies Inc., Murray Hill, N.J.

[21] Appl. No.: 430,963

[22] Filed: Apr. 28, 1995

Related U.S. Application Data

[63] Continuation-in-part of Ser. No. 268,465, Jun. 30, 1994.
[51] Int. Cl.$^6$ ................................................ H05K 3/42
[52] U.S. Cl. ............................................ 29/852; 174/266
[58] Field of Search ................................. 29/602.1, 852, 29/853, 846, 830; 174/266

[56] References Cited

U.S. PATENT DOCUMENTS

| | | | |
|---|---|---|---|
| 3,349,480 | 10/1967 | Rashleigh | 29/852 |
| 4,522,671 | 6/1985 | Grunwald et al. | 156/235 |
| 4,543,715 | 10/1985 | Iadarola et al. | |
| 4,775,465 | 10/1988 | Meinel | 336/65 |
| 5,029,043 | 7/1991 | Kitahara et al. | 361/321 |
| 5,136,120 | 8/1992 | Craft et al. | 174/35 |
| 5,161,098 | 11/1992 | Balakrishnan | 363/144 |
| 5,239,744 | 8/1993 | Fleming et al. | 29/602.1 |

FOREIGN PATENT DOCUMENTS

| | | |
|---|---|---|
| 0467698A2 | 1/1992 | European Pat. Off. . |
| 54-039322 | 10/1980 | Japan . |
| 56-120058 | 2/1983 | Japan . |
| 56-152447 | 3/1983 | Japan . |
| 58-247125 | 7/1985 | Japan . |
| 59-212335 | 5/1986 | Japan . |
| 62-254879 | 4/1989 | Japan . |
| 63-297083 | 6/1990 | Japan . |
| 1-297487 | 7/1991 | Japan . |
| 2252208 | 7/1992 | United Kingdom . |

OTHER PUBLICATIONS

Patent Abstract of Japan, vol. 14, No. 546 (E–1008), Dec. 4, 1990 & JP–A–02 232986 (Sony Corp.), 14 Sep. 1990.
Abstract "Development of Miniaturized DC–DC Converter with Multilayer Ceramic Transformer", Takaya, Mochizuki, Nakano, Kobuke, Authors; pp. 269–574, ISHM "92 Proceedings.
"An Inductor/Capacitor Hybrid Made of Ferrite Only", Sakak, Autor; pp. 3009–3011, IEEE Transactions on Magnetics, vol. 28, No. 5, Sep. 1992.
"Design of High–Frequency Hybrid Power Transformer", Grtadzki and Lee, Authors; pp. 319–326, IEEE, 1988/ CH2504–9/88/0000–0319.
"Electronic Materials Handbook", vol. 1–Packaging, prepared/ASM International, Handbook Committee, of ASM International, Materials Park, OH 44073, pp. 187–189.

*Primary Examiner*—Carl E. Hall
*Attorney, Agent, or Firm*—Glen E. Books

[57] ABSTRACT

The thickness uniformity of a plated metal layer inside a via hole can be enhanced by intersecting a conductive via with an insulating aperture before plating. The new via configuration improves the mass transfer of the plating. It is believed that the apertures lower the local solution ohmic resistance near the via holes. The method can be applied to the manufacture of a wide variety of circuit boards.

6 Claims, 2 Drawing Sheets

METHOD FOR FABRICATING HIGHLY CONDUCTIVE VIAS

CROSS-REFERENCE TO RELATED APPLICATION

This is a continuation-in-part of U.S. patent application, Ser. No. 268,465, entitled "Devices Using Metallized Magnetic Substrates" and filed Jun. 30, 1994 by D. A. Fleming et al.

FIELD OF THE INVENTION

This invention relates to methods for fabricating plated through-hole vias between major surfaces of substrates such as circuit boards. The method provides highly conductive vias of enhanced plating uniformity.

BACKGROUND OF THE INVENTION

Conductive vias are an important feature of circuit boards. There are two types of vias—filled vias and plated through-hole vias. Filled vias are typically used in co-fired, multilayer ceramic substrates. Plated vias are generally used in single or multilayer epoxy-glass circuit boards, although they can be used with ceramic substrates. Filled vias are solid columns extending between the two surfaces. Plated vias are hollow. This invention relates to plated vias.

Plated vias are used for either electrical or thermal conduction. Plated vias for electrical conduction provide electrical connection between conductors on one side of the board to those on the other, and to inner layer conductors in the case of multilayer boards. Plated vias for thermal conduction transfer heat generated from components on one side of the circuit board to the other for more efficient heat dissipation.

Current processing steps for fabricating plated vias are: (1) forming the via, (2) making the via inner wall surface conductive, and (3) electroplating copper on the circuit board, including vias. Because the via dimension is substantially smaller than that of the circuit board, the copper plating within the via is difficult to control and the thickness distribution tends to be non-uniform along the via. The non-uniformity of copper thickness distribution within the vias directly deteriorates the performance of both electrical and thermal vias. Accordingly, there is a need for an improved process for making vias of enhanced conductivity and uniformity.

SUMMARY OF THE INVENTION

The present inventors have discovered that the thickness uniformity of a plated metal layer inside a via hole can be enhanced by intersecting a conductive via with an insulating aperture before plating. The new via configuration improves the mass transfer of the plating. It is believed that the apertures lower the local solution ohmic resistance near the via holes. The method can be applied to the manufacture of a wide variety of circuit boards.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
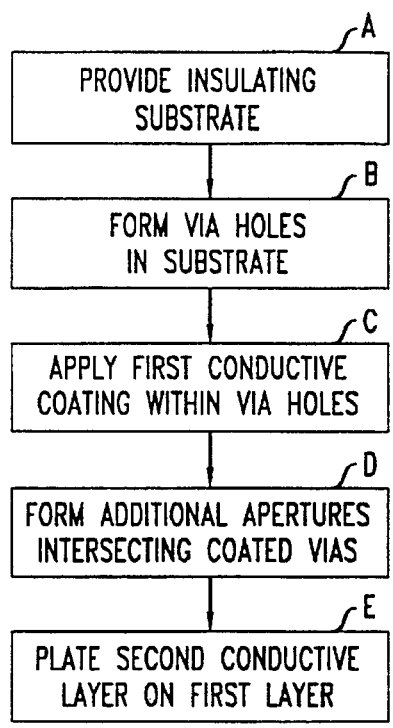
FIG. 1 is a block diagram showing the steps in making plated through-hole vias in a substrate.

Referring to the drawings, as shown in FIG. 1, block A, the first step in making vias is to provide an insulating substrate having at least a pair of major surfaces through which the via holes are to be formed. If the vias are to be formed in a ceramic, the initial substrate can be one or more layers of unsintered, green tape of the ceramic material.

Figure 2:
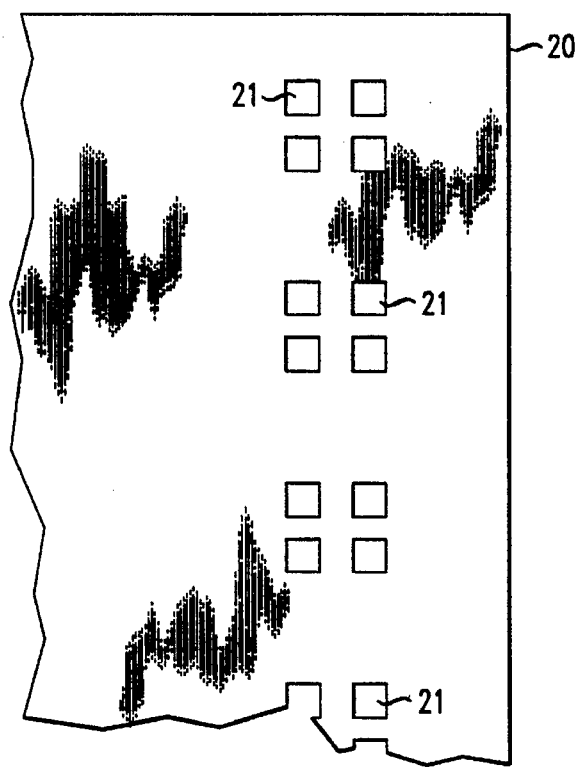
FIGS. 2–4 illustrate a typical substrate during successive steps in the process of FIG. 1.

The next step shown in block B is to form via holes in the substrate. This can be accomplished in a conventional manner using a punch press. FIG. 2 illustrates a portion of a green tape substrate 20 having a plurality of punched via holes 21. Although the via holes shown in FIG. 2 are square, they can be rectangular, circular or any other shape.

Figure 3:
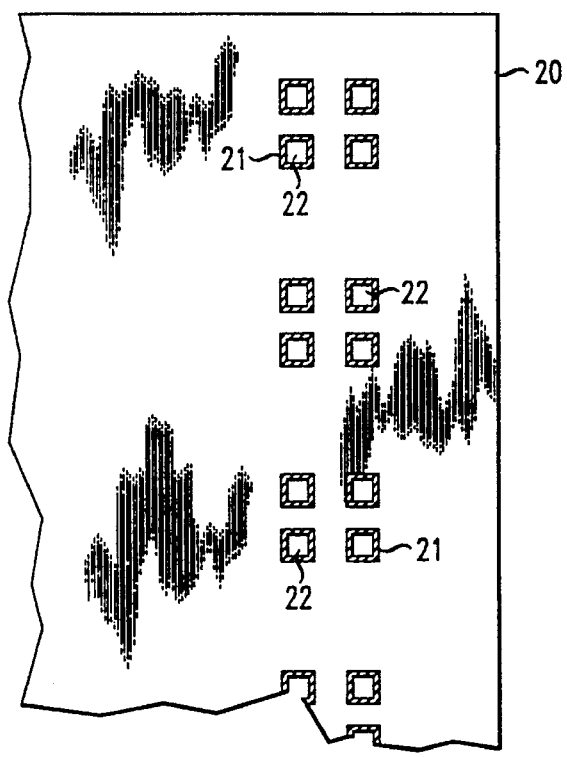

The third step (block C of FIG. 1) is to apply a thin, continuous coating of conductive material within the via holes. This coating, referred to as a borecoat, is too thin to provide the desired final via conductivity, but it is useful in the subsequent plating process. A preferred way of providing the borecoat is to print a conductive ink through a metal mask using vacuum assist to coat the vertical sidewall surface of each conductive via. FIG. 3 shows the substrate 20 after the vias 21 have received their borecoat 22.

Figure 4:
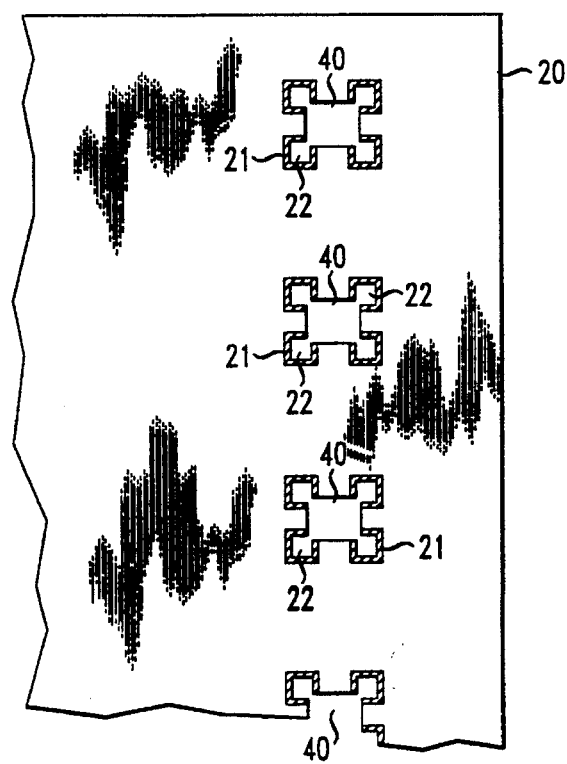

The next step, shown in block D, is to form in the substrate, apertures which intersect the borecoated vias. For rectangular vias, the apertures are preferably rectangular and are punched in each tape layer such that aperture edges intersect a plurality via holes to form crenelated edges including a plurality of conductive edge vias. This is illustrated in FIG. 4 wherein apertures 40 intersect via holes 21. For round via holes, the apertures can be circular or rectangular.

Advantageously at this point, surface metallization patterns can be applied. For example, conductive paste can be screen printed on one or more major surfaces of the tape.

The fifth step (block E of FIG. 1) is to plate the borecoated vias with conductive metal. If the substrate is a ceramic tape construction, as preliminary steps, the tape layers should be laminated together and sintered to produce a substrate with co-fired metallized regions. Metal, such as copper, is then plated onto the metallized regions to increase their thickness in a uniform manner. While the preferred embodiment is making conductive vias in ceramic substrates, the same method can be used with epoxy-glass printed circuit boards by substituting drilling for hole and aperture punching. The technique for drilling in printed circuit boards is well known and is described in *Printed Circuit Handbook* pp. 2.7–2.11, C. F. Coombs, Jr., ed (McGraw Hill, 1988) which is incorporated herein by reference.

The invention and its advantages can be more clearly understood by consideration of the following specific example.

EXAMPLE 1

A metallized substrate was fabricated using the processes illustrated in FIGS. 1–4. Ferrite green tapes, 0.030 inch thick, were obtained from Steward Inc. (Chattanooga, Tenn.). Via hole patterns similar to those in FIG. 2 were obtained by punching to produce 40×40 mil square via holes on 60 mil centers in a 4 hole square pattern. A silver-palladium ink was printed through a metal mask using vacuum assist to coat the vertical side wall surface of each via hole to form borecoated vias (FIG. 3). Apertures were then punched in each tape layer such that the apertures edges intersected the via holes, as illustrated in FIG. 4, to form crenelated edges including a plurality of conductive edge vias. The apertures eliminated about 11% of each via perimeter. Silver-palladium paste was then used to screen print surface metallization patterns on the top side of the upper most tape layer and the bottom side of the lower most tape layer.

Four tape layers were then laminated together and sintered at 1145° C. for 10 hours to produce a co-fired metallized ferrite substrate. The sintered thickness was 100 mils. The final pattern after sintering shrinkage comprised 32×32 mil via holes and 32 mil apertures.

Copper was then deposited electrolytically using a CUPRACID copper plating bath with the CT basic leveller commercially available from Atotech (State College, Pa.). The plating bath was held at 25° C. with a brightener concentration of 3 ml/L and a leveller concentration of 15 ml/L. The agitation was provided by air sparging and periodic flow reversal using a modified horizontal rod agitator (Kocour Model A83) with a speed of 2.3 cm/sec and a forward and reverse cycle of two seconds. The plating ram was approximately 1.67 mil/hour. The total copper thickness deposited was about 4 mils.

The sample was cross sectioned to determine the copper thicknesses at the top and bottom surfaces, and inside the via. The copper thickness inside the via varies between 85% and 110% of the average copper thickness on the substrate surface.

To provide a basis for comparison, a second similar sample was made with slightly smaller via holes but no intersecting apertures prior to plating. The via holes were 30×30 mils after sintering. The copper thickness inside the via varies between 55% and 90% of the average copper thickness on the substrate. Thus the presence of the aperture resulted in significant improvement of copper thickness distribution inside the via. The improvement on the uniformity of the via thickness profile would increase the thermal and electrical conductance. The effect of the improved copper thickness distribution inside the via is to increase the thermal conductance by about 75%.

It is to be understood that the above-described embodiments are illustrative of only a few of the many possible specific embodiments which can represent applications of the principles of the invention. Numerous and varied other arrangements can be devised by those skilled in the art without departing from the spirit and scope of the invention.

The invention claimed is:

1. A method for making conductive vias in an insulating substrate comprising the steps of:

providing an insulating substrate having a pair of major surfaces;

forming a plurality of via through-holes in said substrate between said major surfaces;

applying a first coating of conductive material to said substrate within said via holes;

forming one or more apertures in said substrate intersecting said conductively coated via holes so that the peripheries of the resulting composite apertures include both conductively coated via portions and insulating portions; and plating said conductively coated via portions with a second layer of conductor.

2. The method of claim 1 wherein said substrate is sintered ceramic and said via holes and said apertures are made by punching the ceramic prior to sintering.

3. The method of claim 1 wherein said substrate is printed circuit board and said via holes and apertures are made by drilling.

4. The method of claim 1 wherein said via holes are rectangular.

5. The method of claim 1 wherein said via holes are rectangular; said apertures are rectangular; and at least one aperture edge intersects a plurality of vias to form a crenelated edge including a plurality of conductive via edges.

6. The method of claim 1 wherein said second layer of conductor is copper.

* * * * *